United States Patent [19]

Natsuaki et al.

[11] Patent Number: 4,729,964
[45] Date of Patent: Mar. 8, 1988

[54] METHOD OF FORMING TWIN DOPED REGIONS OF THE SAME DEPTH BY HIGH ENERGY IMPLANT

[75] Inventors: Nobuyoshi Natsuaki, Higashiyamato; Masao Tamura, Tokorozawa; Yasuo Wada, Tokyo; Kiyonori Ohyu, Hachioji; Tadashi Suzuki; Hidekazu Okuhira, both of Kokubunji; Akira Shintani, Machida; Shoji Syukuri, Koganei, all of Japan

[73] Assignee: Hitachi, Ltd., Tokyo, Japan

[21] Appl. No.: 852,184

[22] Filed: Apr. 15, 1986

[30] Foreign Application Priority Data

Apr. 15, 1985 [JP] Japan .................................. 60-78349

[51] Int. Cl.⁴ ..................... H01L 21/265; H01L 21/22
[52] U.S. Cl. ................................... 437/29; 357/91; 437/34; 437/36; 437/56; 437/150; 437/953
[58] Field of Search ............... 29/571, 576 B; 148/1.5, 148/187; 357/91

[56] References Cited

U.S. PATENT DOCUMENTS

| | | | |
|---|---|---|---|
| 4,111,720 | 9/1978 | Michel et al. | 148/1.5 |
| 4,198,250 | 4/1980 | Jecmen | 148/1.5 |
| 4,382,826 | 5/1983 | Pfleiderer et al. | 148/1.5 |
| 4,485,552 | 12/1984 | Magdo et al. | 29/577 C |
| 4,506,436 | 3/1985 | Bakeman, Jr. et al. | 29/577 C |
| 4,535,532 | 8/1985 | Lancaster | 29/576 B |
| 4,558,508 | 12/1985 | Kinney et al. | 29/571 |
| 4,599,118 | 7/1986 | Han et al. | 148/1.5 |

OTHER PUBLICATIONS

Takahashi et al., J. Appl. Phys. 54, (1983), 6041.
Byrne et al., in Mat. Res. Soc. Symp., vol. 27 (ed).
Hubler et al., 1984, North Holland, N.Y. p. 253.
Lai et al., IEEE-Trans. Electron Devices, Ed-33, (1986), 1308.
Terrill et al., IEDM, 1984, pp. 406-409.
Wordeman et al., IEDM, 1981, pp. 40-43.

*Primary Examiner*—Upendra Roy
*Attorney, Agent, or Firm*—Antonelli, Terry & Wands

[57] ABSTRACT

First conductivity type impurity ions are implanted at a predetermined depth all over a region where impurity ions are to be implanted, and second conductivity type impurity ions are implanted in a dose about twice as large as that of the first conductivity type impurity ions at substantially the same implantation depth of the first conductivity type impurity ions, followed by annealing.

In this way, mutually contiguous first and second conductivity type regions having substantially the same impurity concentrations and located at substantially the same depths are formed.

19 Claims, 12 Drawing Figures

METHOD OF FORMING TWIN DOPED REGIONS OF THE SAME DEPTH BY HIGH ENERGY IMPLANT

BACKGROUND OF THE INVENTION

The present invention relates to a process for producing a semiconductor device, and more specifically to a process for producing a semiconductor device especially well adapted to formation of well regions of CMOS or the like with a high precision.

As is well known, the well region of CMOS has heretofore been formed by ion implantation of p- and n-type impurities into the surface of a semiconductor substrate with an acceleration energy of about 50 to 100 KeV, followed by a heat treatment to diffuse the above-mentioned impurities into the depths of the above-mentioned semiconductor substrate.

The above-mentioned conventional process has involved various problems such as a necessity for a high-temperature and lengthy heat treatment and a difficulty in providing a high-precision well region.

In view of this, there is a proposal of forming a well region with a very high ion acceleration voltage in ion implantation processing. For example, a thesis under the title of "MeV Implantation for Silicon Device Fabrication" in Solid State Technology, May (1984), includes a description pointing out that formation of a well of CMOS by ion implantation with a high energy is not only able to reduce the cost increase accompanying a heat treatment and the difficulties caused by deformation of a wafer or the like as compared with conventional processes, but also is effective in preventing soft errors caused by incidence of α rays since a high concentration region can be formed in the deep portion of a semiconductor substrate. According to high energy ion implantation, however, a difficulty is encountered in implanting ions in a predetermined region with a high fidelity to a mask having a fine pattern necessary for formation of ULSI (ultra-large scale integrated circuit) because of a large dispersion in the flight of ions. Besides, in high energy ion implantation, the controllability of the active impurity concentration in the surface region of the substrate in which a MOSFET is to be formed is so poor that a difficulty may be encountered in precisely adjusting the impurity concentration in the surface region to a desired value. Thus, various problems are presented in putting the process into practical use. Furthermore, a thick film made of a heavy element must be employed as the mask in high energy ion implantation, so that not only materials usable in the mask are limited, but also no simple process like selective oxidation that has heretofore be employed can be employed for formation of p- and n-type wells by the self-alignment technique, leading to inevitable adoption of a complicated process for formation of a mask.

SUMMARY OF THE INVENTION

An object of the present invention is to provide a process for producing a semiconductor device, which can solve the above-mentioned problems of the conventional processes, in which mutually contiguous p- and n-type regions can be easily formed with a high precision, and in which the impurity concentration in the surface region of a substrate wherein an active element is to be formed can be controlled with a high precision.

For the purpose of attaining the above object, according to the present invention, ions of a first conductivity type impurity are first implanted all over the region wherein wells are to be formed. Subsequently, a region to be converted into a first conductivity type well region is covered with a mask, and ions of an impurity of second conductivity type opposite to the above-mentioned first conductivity type are implanted in the exposed region in a dose about twice (1.5 to 2.5 times) as large as that of the above-mentioned first conductivity type impurity to form P- and n-type regions having mutually approximately equivalent impurity concentrations.

DETAILED DESCRIPTION OF THE PREFERRED EMBODIMENTS

Figure 1:
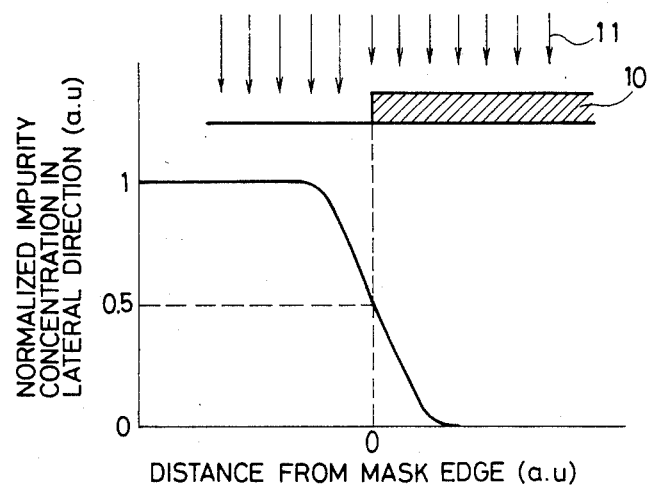
FIG. 1 is a model diagram illustrative of the principle of the present invention.

Since the form of range struggling, in the lateral direction, of implanted atoms (impurities) can be approximated by the Gaussian distribution, the form of distribution of the implanted ionic atom concentration in the lateral direction in the vicinity of a mask edge can be approximated by a complementary error function. Specifically, as shown in FIG. 1, when ions 11 are implanted through a mask 10, the impurity concentration at the edge of the mask 10 reaches about one half of the concentration set by the dose of implantation. Accordingly, in order to reverse the conductivity type at the edge of the mask 10 with good precision, a first conductivity type impurity is first doped all over the surface, and a second conductivity type impurity is implanted in such a dose as to provide a concentration about twice as high as that of the first conductivity type impurity through the mask.

This makes the concentrations of the first and second conduction type impurities in a portion just beneath the edge of the mask approximately mutually equivalent to offset each other, so that the concentrations of the first and second conductivity type impurities in this portion may reach zero.

The second conductivity type impurity concentration in the portion not covered with the mask 10 reaches about one half of the concentration of the implanted second conductivity type impurity, since the first conductivity type impurity is previously implanted at a concentration of about one half of the implanted second conductivity type impurity.

Thus, the first conductivity type impurity concentration in the portion covered with the mask 10 becomes substantially equal to the second conduction type impurity concentration in the portion not covered with the mask 10. This is favorable in many cases of ordinary CMOS.

Formation of wells of CMOS according to the present invention is as follows. A desired amount of a first conductivity type impurity is doped all over a region, where first and second conductivity type wells are to be formed, by ion implantation with an energy enough to secure desired depth. Subsequently, a mask having an opening corresponding to only a region where a second conductivity type well is to be formed is formed on the surface of a substrate, and a second conductivity type impurity is doped in a dose about twice as large as that of the first conductivity type impurity by ion implantation with an energy enough to provide the same depth as in the case of the first conductivity type impurity. This can provide a boundary between the first and second conductivity type wells faithfully at the edge of the mask since the concentrations of the both conductivity type impurities become mutually equivalent to offset each other at the edge of the mask as described hereinbefore. The carrier concentration in the region not covered with the mask, namely in the second conductivity type region, becomes approximately equivalent to the carrier concentration in the first conductivity type well since the former concentration is offset by the concentration of the first conductivity type impurity previously implanted. Accordingly, where the first and second conductivity type wells are to be formed in mutual contiguity by the self alignment technique, both wells can be formed by only one mask.

Figure 2:
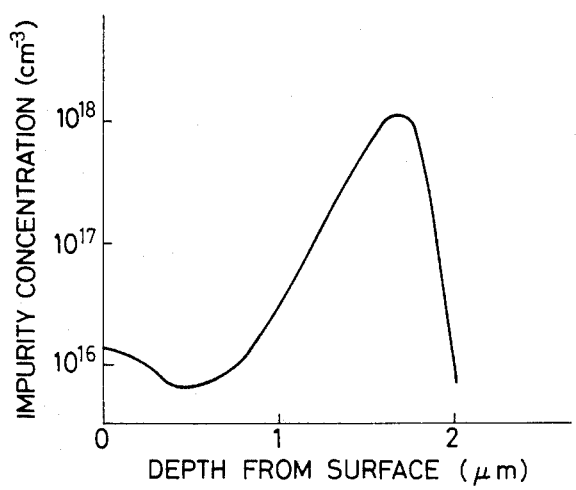
FIG. 2 is a diagram showing a depth profile of an impurity.

It is important in well formation that the impurity concentration in a surface region of the substrate, particularly in a region where a channel region of a MOS transistor is to be formed, be controlled at a desired level within a low concentration range of around $10^{16}/cm^3$. In the present invention, the impurity concentration in the surface region can be controlled at a desired level with very high precision by another ion implantation in the surface portion of the well as separate from that in the deep portion. The impurity concentration of the well in the bottom portion of a drain junction is not desired to be so high from the viewpoint of capacity though it depends on the punch through between the source and drain of the MOS transistor. Specifically, it is generally desirable that, as shown in FIG. 2, the depth profile of impurity concentration in a well region comprise such a relatively high impurity concentration in a surface portion of a substrate as to be necessary for control of a threshold voltage and prevention of punch through insofar as it involves no problem of a decrease in carrier mobility, a little lower impurity concentration in a portion slightly lower than the bottom portion of a drain junction, and such a high impurity concentration at a depth of the bottom portion of the well as to be sufficient for prevention of α-ray soft errors and punch through. It is most preferred for the purpose of providing such a depth profile of impurity concentration that ion implantation for setting the impurity concentration in the surface portion of a substrate be performed separately as described above. According to the present invention, since formation of a mask for such ion implantation by the self alignment technique can be effected by utilizing a treatment with an atmosphere capable of oxidizing only an Si substrate without oxidizing a metallic implantation mask for formation of the deep portion of a well, the depth profile of impurity concentration can be controlled with sufficiently high precision without complicating the process.

EXAMPLE 1

Figure 3A:
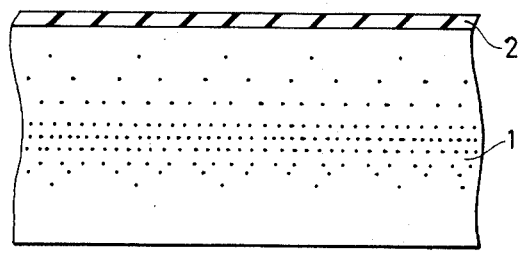
FIGS. 3a to 3d, 4a to 4c, and 5a to 5c are process diagrams showing mutually different examples of the present invention.
Figure 3B:
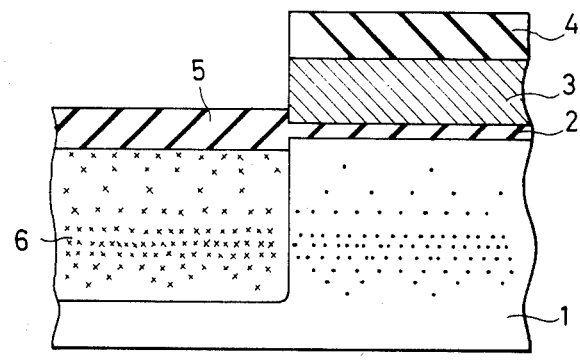
Figure 3C:
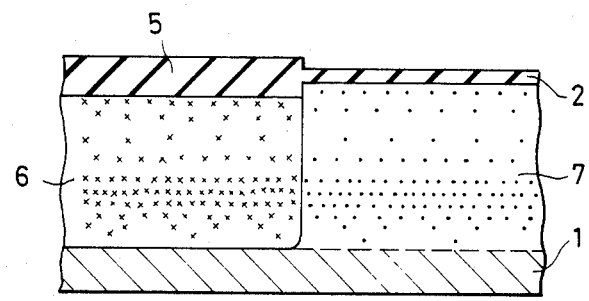

An example of the present invention will now be illustrated with reference to FIGS. 3a to 3d. FIGS. 3a to 3c are illustrations concerning only formation of mutually contiguous p- and n-type wells in a series of steps of the process for manufacturing a semiconductor device. The other preceding and subsequent steps are excluded from the illustrations because those of a well-known process can be employed as them.

$1 \times 10^{13}/cm^2$ of boron ions were first implanted in a portion of a p-type Si substrate 1, where wells are to be formed, through an SiO$_2$ film 2 of 20 nm in thickness as shown in FIG. 3a with an energy of 1 MeV to dope the boron atoms at an average flight of about 1.7 μm deep from the surface of the substrate.

In FIGS. 3a to 3c, points and crosses shown in the Si substrate symbolically stand for p- and n-type impurities, respectively, which are ion-implanted.

Subsequently, a W film 3 having a thickness of 0.8 μm and a PSG film 4 having a thickness of 0.2 μm and a phosphorus concentration of 1.5 mol % were formed, followed by removal of a desired portion thereof by the ordinary lithographic and dry etching techniques to form a mask as shown in FIG. 3b. $2 \times 10^{11}/cm^2$ of phosphorus ions were then implanted with an energy of 50 KeV to dope the surface portion of the substrate 1 with phosphorus atoms through the opening of the above-mentioned mask. Thereafter, a heat treatment was performed in an atmosphere of H$_2$ and H$_2$O gases to oxidize only the surface portion of the substrate inside the opening of the mask. Thus, an SiO$_2$ film 5 having a thickness of 0.3 μm was formed. Subsequently, $2.5 \times 10^{13}/cm^2$ of phosphorus ions were implanted with an energy of 3.5 MeV to dope with phosphorus atoms at a depth of about 1.7 μm as in the above-mentioned case of boron atom doping. After removal of the PSG film 4 and the W film 3, $3 \times 10^{11}/cm^2$ of boron ions were implanted with an energy of 20 KeV to dope the surface portion of the substrate with boron ions in a region having no formed SiO$_2$ film 5. Finally, annealing was performed in an atmosphere of an N$_2$ gas to activate all the implanted ions. Thus, an n-type well region 6 and a p-type well region 7 as shown in FIG. 3c were formed. MOSFET's can be formed on the surfaces of the wells 6 and 7 by removing the SiO$_2$ films 2 and 5, forming gate oxide films, and thereafter following the well-known MOS process.

Figure 3D:
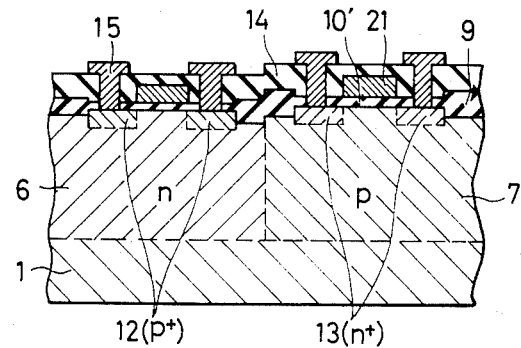

Specifically, for example, as shown in FIG. 3d, after removal of the above-mentioned SiO$_2$ films 2 and 5 by etching, a field oxide film 9 having a thickness of 0.3 μm, a gate oxide film 10', and a gate electrode 21 made of polycrystalline silicon were formed, followed by formation of n$^+$- and p$^+$-type regions 13 and 12 and electrodes 14 and 15 according to the well-known CMOS process. Thus, a CMOS device is formed.

In this example, the W film 3 is directly formed on the SiO$_2$ film 2. Alternatively, however, restriction of a boron ion-implanted portion in the surface portion of a substrate can be made by providing a silicon nitride film between the both films as mentioned above, implanting boron and phosphorus ions with a high energy, implanting phosphorus ions in the surface region of the substrate, removing the PSG film 4 and the W film 3, and effecting ordinary selective oxidation with utilization of the nitride film. Various modifications are possible as regards the choice of the conductivity type of a substrate, the use of an epitaxial substrate, the order of formation of p- and n-type wells, the choice of an implanted impurity, the choice of implantation conditions such as adoption of multi-stage implantation or channelling conditions, the choice of a masking material, and combinations thereof, which are, needless to say, never limited to those employed in this example.

It was recognized that the process of the present invention is remarkably effective not only in formation of mutually contiguous p and n conductivity type wells each having a deep, high concentration impurity region faithful to a mask pattern without blurred localization due to dispersion in the distribution of flight in the lateral direction because of high-energy implantation and easiness in controlling the impurity concentration in the surface portion, but also in avoidance of unnecessary reduction in the channel mobility of carriers due to non-doubled ion implantation of both conductivity type impurities for controlling the impurity concentration in the surface portion.

EXAMPLE 2

Figure 4A:
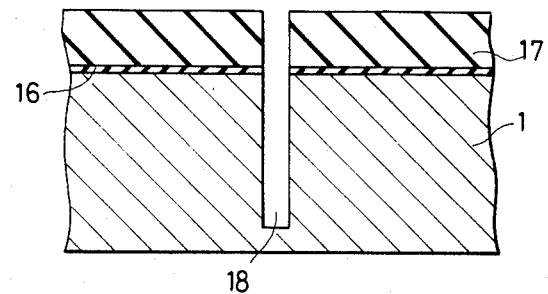
Figure 4B:
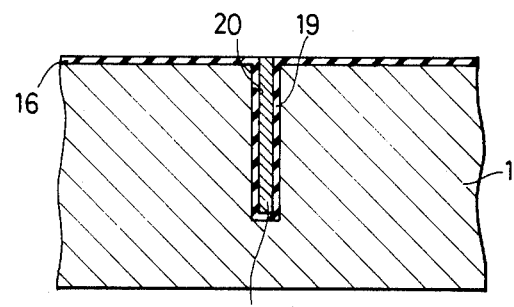
Figure 4C:
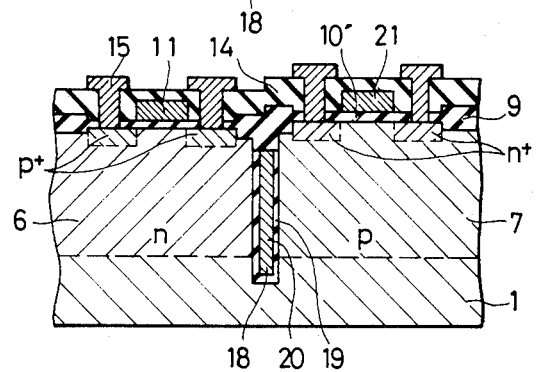

Another example of the present invention will be illustrated with reference to FIGS. 4a to 4c. This example comprises providing a trench isolation structure along the boundary between the p and n conductivity type wells of basically the same CMOS element as illustrated in Example 1. In order to form a structure as shown in FIG. 4c, a trench for isolation has only to be formed in the initial stage of Example 1. Specifically, as in FIG. 4a, a resist film 17 having a thickness of 1 $\mu$m was applied to the surface of a p-type Si substrate 1 having an oxide film 16 formed thereon, and a pattern having an opening was formed in a region, where a boundary between the p and n conductivity type wells were to be disposed, according to the well-known photolithographic technique. Thereafter, a trench 18 having a depth of 2.5 $\mu$m and an opening width of 0.3 $\mu$m was formed by reactive ion etching. An oxide film 19 was formed on the inner wall of the trench 18 by heating in dry oxygen after removal of the resist 17, as shown in FIG. 4b. The inside of the trench 18 was filled with polycrystalline Si 20 according to the LPCVD method, followed by a surface flattening treatment according to the etching back method. The subsequent steps were performed in the same manner as in Example 1 to finally obtain a structure as shown in FIG. 4c. Here, the edge of a metallic W film 3 as a mask in high-energy ion implantation was positioned in the central portion of the trench 18. Although the step of providing the trench isolation structure was performed in the initial stage in this example, it may be performed after high-energy ion implantation.

Since the boundary between the p and n conductivity type wells could be prevented from becoming a depletion layer and each well region was completely enclosed by the trench isolation structure and a high-concentration impurity layer, an effect of further decreasing soft errors with an improved reliability of the element as compared with that in Example 1 was obtained. Furthermore, an effect that the width of the trench isolation structure may be smaller than that in the conventional element was obtained.

EXAMPLE 3

Figure 5A:
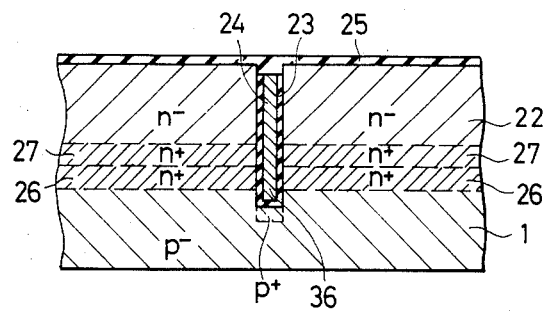
Figure 5B:
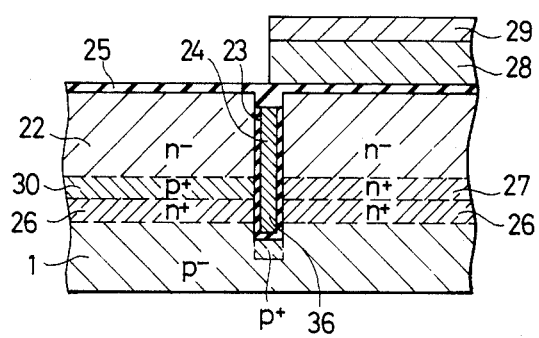
Figure 5C:
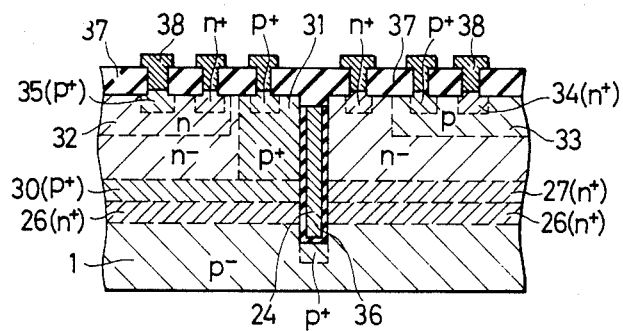

Still another example of the present invention will now be illustrated with reference to FIGS. 5a to 5c. This example is concerned with application of the present invention to production of a compensatory bipolar transistor. As shown in FIG. 5a, an n-type epitaxial layer 22 having a thickness of 1.5 $\mu$m and a specific resistance of 0.6 $\Omega$·m was formed on the surface of a p-type Si substrate, and a trench 36 having a depth of 2 $\mu$m for isolation was formed according to the well-known photolithographic and reactive ion etching techniques. B ions were implanted in the bottom portion of the trench 36, and an oxide film 23 was formed on the inner wall of the trench 36. Polycrystalline Si 24 was filled in the trench, followed by a surface flattening treatment. Thereafter, an oxide film 25 was formed on the surface. Subsequently, P ions were implanted in doses of $5 \times 10^{15}/cm^2$ and $2 \times 10^{15}/cm^2$ with energies of 3 MeV and 2 MeV, respectively, to form n+ layers 26 and 27 having peaks at depths corresponding to average flights of about 1.5 $\mu$m and about 1 $\mu$m, respectively. A metallic W film 28 having a thickness of 0.8 $\mu$m and a PSG film 29 having a thickness of 0.2 $\mu$m were then formed as shown in FIG. 5b, followed by such patterning as to form an opening only in a region, where a pnp transistor was to be formed, according to a well-known method. $5 \times 10^{15}/cm^2$ of B ions were implanted with an energy of 0.6 MeV to form a p+ layer 30 at the sacrifice of the n+ layer 27. Thereafter, as shown in FIG. 5c, the metallic W film 28 and the PSG film 29 were removed, followed by annealing in nitrogen at 950° C. for 30 minutes. According to the well-known process, a leader p+ layer 31 of the p+ layer 30, an n-type base 32, a p-type base 33, an n-type emitter 34, a p-type emitter 35, an isolation oxide film 37, and metallic electrodes 38 were formed to produce a compensatory bipolar transistor.

Since there was no redistribution of impurities in epitaxial growth unlike a conventional process comprising forming doubly buried p+ and n+ layers prior to formation of an epitaxial layer 22, the dimension in the depth-wise direction could be shortened and the resistance of a collector layer could be reduced. As a result, a remarkable speedup effect was observed. Although the buried n+ or p+ layer is used as the collector in the structure of this example, the process is, needless to say, applicable to production of a reverse operation bipolar element in which the buried layer is used as the emitter. The present invention is apparently applicable to formation of a buried collector in a compensatory type I²L (integrated injection logic).

As is apparent from the foregoing description, in accordance with the present invention, a well region or the like is formed by ion implantation with a high energy and subsequent annealing to diffuse the implanted impurity. As a result, a region having a high impurity concentration is formed not in a surface portion but in a deep portion of a semiconductor substrate, so that the damage of $\alpha$ rays is by far smaller than those in conventional semiconductor devices.

In the conventional semiconductor devices, as described hereinbefore, a well region is formed by doping a surface portion of a substrate with an impurity by ion implantation and subsequently annealing the substrate at a high temperature for a long time to diffuse the impurity into the depths of the substrate. As a result, the impurity concentration is highest in the surface portion of the substrate, leading to a defect that the resulting device is liable to be damaged by $\alpha$ rays.

Besides, a difficulty is experienced in forming p- and n-type well regions with high precision because impurities are diffused over a very long distance by annealing at the high temperature for the long time.

In contrast, since the deep portion of a semiconductor device is doped with impurities by ion implantation with a high energy, annealing has only to be performed at a far lower temperature for a far shorter time than in the case of the conventional semiconductor devices. Therefore, the impurity diffusion distance is so short that p- and n-type well regions can be formed with far higher precision than in the case of the conventional semiconductor devices.

The above-mentioned ion implantation into the depths of a substrate in accordance with the present invention is performed preferably at a depth of about 0.8 to 4.5 μm.

The acceleration voltage necessary for implantation of an impurity at a depth as mentioned above varies depending on the kind of impurities to be implanted. For instance, the acceleration voltage is about 500 KeV to about 3 MeV in implantation of boron, about 1 to about 6 MeV in implantation of phosphorus, and about 2 to about 12 MeV in implantation of arsenic, at which implantation at a depth of about 0.8 to 4.5 μm is possible.

Control of the impurity concentration in a shallow portion (surface portion) of a semiconductor substrate can be made with very high precision when ion implantation in the shallow portion is performed separately from the above-mentioned ion implantation in the deep portion. Also in this case, since diffusion over a long distance ranging from a shallow portion to a deep portion is unnecessary unlike the conventional process, annealing has only to be effected at a far lower temperature for a far shorter time than in the conventional process, leading to formation of p- and n-type well regions with a far higher precision than in the conventional process.

As described hereinbefore, in accordance with the present invention, a first conductivity type impurity is first ion-implanted all over a region where p- and n-type wells are to be formed, and a second conductivity type impurity in a dose about twice as large as that of the first conductivity type impurity is doped in a region where a second conductivity type well is to be formed at substantially the same depth as in the above-mentioned ion implantation of the first conductivity type impurity. Since the diffusion rate in the Si substrate differs from kind to kind of impurities, the ratio of the dose of the first conductivity type impurity to that of the second conductivity type impurity is adjusted not precisely to 1:2 but to a range of 1:1.5 to 1:2.5 in many cases. For instance, in the above example, the dose ratio of boron to phosphorus was 1:2.5.

In accordance with the present invention, mutually contiguous p and n wells having high impurity concentrations in a deep portion can be formed with only one high-energy ion implantation mask so faithfully to the mask in a self alignment manner that the precision is less than the standard deviation (ordinarily about 0.2 μm or less) in the distribution of ion flight in the lateral direction. Besides, control of the impurity concentrations in the surface portions of the wells can be made under such conditions as to minimize the reduction of carrier mobility, so that the depth profiles of the impurity concentrations in the wells can be easily optimized. Accordingly, as to the number of steps in a process for forming wells in high performance CMOSULSI, at least two steps can be dispensed with, as compared with the number of steps in conventional processes utilizing the lift-off method or the like.

What is claimed is:

1. A process for producing a semiconductor device comprising the steps of: implanting first conductivity type impurity ions at a predetermined depth all over a region of a workpiece where impurity ions are to be implanted; forming a mask having an edge forming an opening on said workpiece; implanting impurity ions of second conductivity type opposite to said first conductivity type in a dose about twice as large as that of said first conductivity type impurity ions at substantially the same depth as in the step of ion implantation of said first conductivity type impurity ions through said opening so as to make said first and second conductivity type impurity concentrations in a portion just beneath the edge of said mask offset each other and be substantially zero; and annealing the resulting workpiece to form first and second conductivity type regions in a region covered with said mask and a region corresponding to said opening, respectively.

2. A process as claimed in claim 1, wherein said first and second conductivity type impurity ions are further implanted in a portion shallower than said depth.

3. A process as claimed in claim 1, wherein the impurity ions of second conductivity type are implanted in said dose, to make the second conductivity type impurity concentration in a portion not covered by said mask become substantially equal to the first conductivity type impurity concentration in a portion covered with said mask.

4. A process as claimed in claim 1, wherein the impurity ions of second conductivity type are implanted in said dose such that said first conductivity type region does not extend beyond the edge of the mask, and said second conductivity type region does not extend beneath said mask.

5. A process as claimed in claim 3, comprising the further steps of forming at least one active element in said first conductivity type region; and forming at least one active element in said second conductivity type region.

6. A process as claimed in claim 5, wherein said workpiece is a semiconductor substrate.

7. A process as claimed in claim 5, wherein the implantation depth of said first and second conductivity type impurity ions is about 0.8 μm to 4.5 μm.

8. A process as claimed in claim 5, wherein said first conductivity type impurity ions are boron ions and the acceleration voltage for said ion implantation thereof is 500 KeV to 3 MeV.

9. A process as claimed in claim 5, wherein said impurity ions of second conductivity type are phosphorus ions and the acceleration voltage for said ion implantation is 1 to 6 MeV.

10. A process as claimed in claim 5, wherein said impurity ions of second conductivity type are arsenic ions and the acceleration voltage for said ion implantation thereof is 2 to 12 MeV.

11. A process as claimed in claim 5, wherein the dose of said impurity ions of second conductivity type to be implanted is 1.5 to 2.5 times as large as that of said first conductivity type impurity ions implanted.

12. A process as claimed in claim 5, wherein said at least one element formed in said first conductivity type region includes a MOSFET having a channel of the second conductivity type, and said at least one active element formed in said second conductivity type region includes a MOSFET having a channel of the first conductivity type, whereby a CMOS device is formed.

13. A process as claimed in claim 5, wherein said first and second conductivity type impurity ions are further implanted in a portion shallower than said depth.

14. A process as claimed in claim 5, wherein the first and second conductivity type regions are contiguous to each other.

15. A process as claimed in claim 13, wherein said first and second conductivity type impurity ions implanted in a portion shallower than said depth are respectively implanted in said first and second conductivity regions.

16. A process for producing a semiconductor device comprising the steps of: implanting first conductivity type impurity ions all over a region of a workpiece where impurity ions are to be implanted; forming a mask having an opening on said workpiece; implanting impurity ions of second conductivity type opposite to said first conductivity type in such a dose as to reduce the concentrations of said first and second conductivity type impurity ions to substantially zero at the edge of said opening through said opening; and annealing the resulting workpiece to form first and second conductivity type regions in a region covered with said mask and a region corresponding to said opening, respectively.

17. A process as claimed in claim 16, including the further steps of forming at least one active element in the first conductivity type region and at least one active element in the second conductivity type region.

18. A process for producing a semiconductor device comprising the steps of: implanting first conductivity type impurity ions at a predetermined depth all over a region of a workpiece where impurity ions are to be implanted; forming a trench extending from the surface of the workpiece, and forming an insulation material in said trench so as to form a trench isolation structure; forming a mask having an edge forming an opening on said workpiece, said mask being formed such that the edge thereof forming the opening is positioned over the trench; implanting impurity ions of second conductivity type opposite to said first conductivity type in a dose about twice as large as that of said first conductivity type impurity ions at substantially the same depth as in the step of ion implantation of said first conductivity type impurity ions through said opening; and annealing the resulting workpiece to form first and second conductivity type regions in a region covered with said mask and a region corresponding to said opening, respectively, whereby the first and second conductivity type regions are spaced from each other by the trench isolation structure.

19. A process as claimed in claim 18, comprising the further steps of forming at least one active element in said first conductivity type region; and forming at least one active element in said second conductivity type region.

* * * * *